United States Patent
Ikezaki

(12) United States Patent (10) Patent No.: US 8,054,078 B2
(45) Date of Patent: Nov. 8, 2011

(54) PARALLEL IMAGING METHOD AND MRI APPARATUS

(75) Inventor: Yoshikazu Ikezaki, Tokyo (JP)

(73) Assignee: GE Medical Systems Global Technology Company, LLC, Waukesha, WI (US)

( * ) Notice: Subject to any disclaimer, the term of this patent is extended or adjusted under 35 U.S.C. 154(b) by 1153 days.

(21) Appl. No.: 11/776,115

(22) Filed: Jul. 11, 2007

(65) Prior Publication Data
US 2008/0013811 A1 Jan. 17, 2008

(30) Foreign Application Priority Data
Jul. 12, 2006 (JP) .................................. 2006-190999

(51) Int. Cl.
*G01V 3/00* (2006.01)

(52) U.S. Cl. ....................................... 324/309; 324/307

(58) Field of Classification Search .......... 324/300–322; 600/407–445; 382/131
See application file for complete search history.

(56) References Cited

U.S. PATENT DOCUMENTS

| 4,751,643 | A | 6/1988 | Lorensen et al. |
| 4,984,157 | A | 1/1991 | Cline et al. |
| 5,410,250 | A | 4/1995 | Brown |
| 6,841,998 | B1 * | 1/2005 | Griswold ....................... 324/309 |
| 6,950,543 | B2 | 9/2005 | King et al. |
| 7,098,908 | B2 | 8/2006 | Acosta et al. |
| 7,288,937 | B2 | 10/2007 | Nabetani |
| 7,511,495 | B2 * | 3/2009 | Kholmovski et al. .......... 324/310 |
| 7,782,058 | B2 * | 8/2010 | Hardy et al. ................... 324/318 |
| 2008/0221433 | A1 * | 9/2008 | Doyle ........................... 600/422 |
| 2009/0285463 | A1 * | 11/2009 | Otazo et al. ................... 382/131 |
| 2010/0013472 | A1 * | 1/2010 | Buehrer et al. ................ 324/307 |
| 2011/0148410 | A1 * | 6/2011 | Zaitsev et al. ................. 324/309 |

FOREIGN PATENT DOCUMENTS

| JP | 06075563 | 3/1994 |
| JP | 09026473 | 1/1997 |
| JP | 2001187038 | 7/2001 |
| JP | 2003-079595 | 3/2003 |
| JP | 2004000593 | 1/2004 |
| JP | 2004298212 | 10/2004 |
| JP | 2005168868 | 6/2005 |
| JP | 2005328853 | 12/2005 |

OTHER PUBLICATIONS

Pruessmann et al.; "Sense: Sensitivity Encoding for Fast MRI"; Magnetic Resonance in Medicine 42:952-962 (1999).

* cited by examiner

*Primary Examiner* — Brij Shrivastav
(74) *Attorney, Agent, or Firm* — Armstrong Teasdale LLP

(57) ABSTRACT

An object of the present invention is to obtain a composite image by a small computation amount and short process time in parallel imaging using three or more reception coils. By performing a scan using three or more reception coils and with reduced phase encoding steps, data of the reception coils is collected, and an image is generated from each of the data. A combination of images used for unfolding operation is selected from combinations of the images, and a composite image is obtained by operation using the selected combination of images and a square matrix of sensitivity coefficients of the corresponding reception coils.

20 Claims, 4 Drawing Sheets

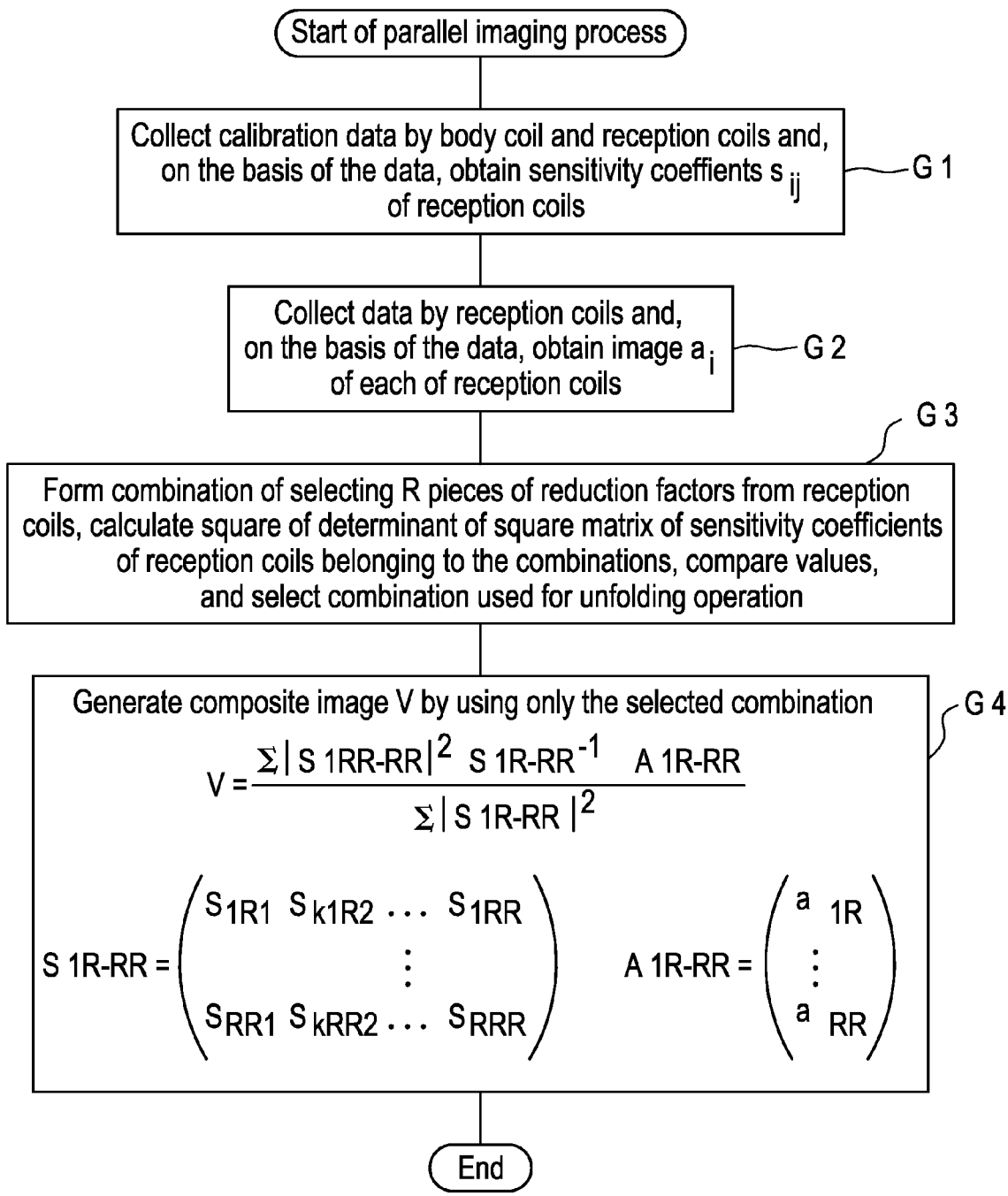

PARALLEL IMAGING METHOD AND MRI APPARATUS

CROSS REFERENCE TO RELATED APPLICATIONS

This application claims the benefit of Japanese Application No. 2006-190999 filed Jul. 12, 2006.

BACKGROUND OF THE INVENTION

The present invention relates to a parallel imaging method and an MRI (Magnetic Resonance Imaging) apparatus. More particularly, the invention relates to a parallel imaging method and an MRI apparatus capable of obtaining a composite image by unfolding operation with a small computation amount and short process time by using three or more reception coils.

Hitherto, a parallel imaging method is known in which a scan with reduced number of phase encoding steps is performed by using a plurality of reception coils, data of the reception coils is collected, images are generated from the data, and a composite image is obtained by unfolding a folded image by unfolding operation using the difference of sensitivity distributions of the reception coils (refer to, for example, Patent Document 1 and Non-Patent Document 1).

[Patent Document 1] Japanese Unexamined Patent Publication No. 2003-79595

[Non-Patent Document 1] Klaas P. Pruessmann et al. "SENSE: Sensitivity Encoding for Fast MRI", Magnetic Resonance in Medicine 42 (1999), pp. 952-962

The conventional unfolding operation has a problem such that when the number of reception coils becomes N ($\geq 3$), the computation amount increases by the number of possible combinations of two values in N as compared with that in the case where the number of reception coils is 2, and the computation amount sharply increases. For example, when the number of reception coils is three, the computation amount increases by three times. When the number of reception coils is four, the computation amount increases by six times.

SUMMARY OF THE INVENTION

Therefore, an object of the present invention is to provide a parallel imaging method and an MRI apparatus capable of obtaining a composite image by unfolding operation using three or more reception coils with a small computation amount and short process time.

In a first aspect, the present invention provides a parallel imaging method comprising the steps of: performing a scan using three or more reception coils and with reduced phase encoding steps and collecting data of the reception coils; generating an image from the data of each of the reception coils; selecting a combination of images used for unfolding operation from combinations of the images; and obtaining a composite image by operation using the selected combination of images and a square matrix of sensitivity coefficients of the corresponding reception coils.

Generally, in the parallel imaging method, complex images $C(n)$ are generated from calibration data $c(n)$ of N reception coils, images $C(0)$ of complex number are generated from calibration data $c(0)$ of a body coil, and the images $C(n)$ of the reception coils are divided by the images $C(0)$ of the complex number of the body coil, thereby obtaining a sensitivity map $s(n)$ of each of the reception coils. From a sensitivity matrix S in which the sensitivity maps $s(n)$ of the reception coils are arranged in order and an image matrix A in which complex images $a(n)$ generated from data $h(n)$ of the reception coils are arranged in order, a composite image V is obtained by the following equation.

$$V = (S^*\psi^{-1}S)^{-1}S^*\psi^{-1}A$$

In the equation, $S^*$ denotes conjugate transpose of S, and $\psi$ denotes a noise correlation matrix. The computation is performed pixel by pixel.

The equation is described in the non-patent document 1 (Klaas P. Pruessmann et al. "SENSE: Sensitivity Encoding for Fast MRI", Magnetic Resonance in Medicine 42 (1999), pp. 952-962).

When the noise correlation matrix is not used for simpler explanation, Equation 1 is derived.

$$V = (S^*S)^{-1}S^*A \qquad \text{EQUATION 1}$$

For example, when the number of reception coils=3 and the reduction factor R=2, Equation 2 is derived.

$$S = \begin{pmatrix} s_{11} & s_{12} \\ s_{21} & s_{22} \\ s_{31} & s_{32} \end{pmatrix} \qquad \text{EQUATION 2}$$

$$S = \begin{pmatrix} \overline{s_{11}} & \overline{s_{21}} & \overline{s_{31}} \\ \overline{s_{12}} & \overline{s_{22}} & \overline{s_{32}} \end{pmatrix}$$

$$A = \begin{pmatrix} a_1 \\ a_2 \\ a_3 \end{pmatrix}$$

"$a_i$" denotes a pixel value of a point on an image of a reception coil of an "i" channel.

$s_{i1}$ and $s_{i2}$ denotes sensitivity coefficients corresponding to reception coils of the "i" channel of original two points superimposed at the point on the image of the reception coil of the "i" channel by folding.

Substitution of Equation (2) into Equation (1) develops to Equation (3).

$$V = \frac{|S12|^2 S12^{-1} A12 + |S13|^2 S13^{-1} A13 + |S23|^2 S23^{-1} A23}{|S12|^2 + |S13|^2 + |S23|^2} \qquad \text{EQUATION 3}$$

$$S12 = \begin{pmatrix} s11 & s12 \\ s21 & s22 \end{pmatrix}$$

$$A12 = \begin{pmatrix} a1 \\ a2 \end{pmatrix}$$

$$S13 = \begin{pmatrix} s11 & s12 \\ s31 & s32 \end{pmatrix}$$

$$A13 = \begin{pmatrix} a1 \\ a3 \end{pmatrix}$$

$$S23 = \begin{pmatrix} s21 & s22 \\ s31 & s32 \end{pmatrix}$$

$$A23 = \begin{pmatrix} a2 \\ a3 \end{pmatrix}$$

$|Skm|^2$ denotes the square of a determinant using, as a first row, sensitivity coefficients $s_{k1}$ and $s_{k2}$ of a reception coil of a "k" channel and using, as a second row, sensitivity coefficients $s_{m1}$ and $s_{m2}$ of the reception coil of an "m" channel.

Skm denotes a square matrix using, as a first row, the sensitivity coefficients $s_{k1}$ and $s_{k2}$ of the reception coil of the "k" channel and using, as a second row, the sensitivity coefficients $s_{m1}$ and $s_{m2}$ of the reception coil of the "m" channel.

It is understood from Equation 3 that when the number of reception coils becomes N ($\geqq 3$), the computation amount increases by the number of possible combinations of two values in N as compared with the computation amount in the case where the number of reception coils is 2, and the computation amount sharply increases.

When attention is paid to $|S12|^2$, $|S13|^2$, and $|S23|^2$ in Equation 3, if $|S12|^2$ is smaller than $|S13|^2$ and $|S23|^2$, there is hardly any influence even if the term of $|S12|^2$ is ignored. That is, Equation (4) can be derived.

$$V = \frac{|S13|^2 S13^{-1} A13 + |S23|^2 S23^{-1} A23}{|S13|^2 + |S23|^2} \qquad \text{EQUATION 4}$$

In Equation (4), combinations A13 and A23 of images used for unfolding operation are selected from combinations A12, A13, and A23 of images, and a composite image V is obtained by the operation using the selected combinations A13 and A23 and square matrixes S13 and S23 of sensitivity coefficients of the corresponding reception coils.

In the parallel imaging method according to the first aspect, for example, a composite image is obtained by Equation (4). The computation amount is smaller than that in the case of using Equation (3). Therefore, a composite image can be obtained by the unfolding operation in short process time.

According to a second aspect of the present invention, in the parallel imaging method according to the first aspect, a combination of images used for unfolding operation is selected from combinations of the images on the basis of the square of a determinant of a square matrix of sensitivity coefficients of reception coils corresponding to the combination of reception coils.

In the parallel imaging method according to the second aspect, although the square of a determinant of a square matrix of sensitivity coefficients of reception coils corresponding to the combination of reception coils has be to calculated only once, a combination of images used for unfolding operation can be accurately selected from combinations of images.

According to a third aspect of the invention, in the parallel imaging method according to the first aspect, a combination of images used for the unfolding operation is selected from images on the basis of layout of the reception coils and the phase encoding direction.

The square of a determinant of a square matrix of sensitivity coefficients of two reception coils facing each other in the phase encoding direction is much larger than the square of a determinant of a square matrix of sensitivity coefficients of the reception coils arranged in the frequency encoding direction. That is, it is sufficient to select a combination of images of reception coils facing each other in the phase encoding direction and not to select a combination of images of reception coils arranged in the frequency encoding direction.

In the parallel imaging method according to the third aspect, a combination of images used for operation can be selected on the basis of layout of the reception coils and the phase encoding direction without calculating the square of a determinant of a square matrix of sensitivity coefficients of the reception coils.

In a fourth aspect of the present invention, in the parallel imaging method according to any one of the first to third aspects, the reception coils are a first reception coil, a second reception coil provided next to the first reception coil in a frequency encoding direction, and a third reception coil facing the first reception coil in a phase encoding direction, and reduction factor R=2.

In the parallel imaging method according to the fourth aspect, a composite image can be obtained by the unfolding operation with a small computation amount and short process time.

In a fifth aspect of the present invention, in the parallel imaging method according to the fourth aspect, when a pixel value of a point on an image of a reception coil of an "i" channel is $a_i$, sensitivity coefficients corresponding to reception coils of the "i" channel of two points superimposed by folding at the point on the image of the reception coil of the "i" channel are $s_{i1}$ and $s_{i2}$, the square of a determinant using, as a first row, sensitivity coefficients $s_{k1}$ and $s_{k2}$ of a reception coil of a "k" channel and using, as a second row, sensitivity coefficients $s_{m1}$ and $s_{m2}$ of the reception coil of an "m" channel is $|Skm|^2$, and a square matrix using, as a first row, sensitivity coefficients $s_{k1}$ and $s_{k2}$ of the reception coil of the "k" channel and using, as a second row, sensitivity coefficients $s_{m1}$ and $s_{m2}$ of the reception coil of the "m" channel is Skm, the operation is expressed by the following.

$$V = \frac{|S13|^2 S13^{-1} A13 + |S23|^2 S23^{-1} A23}{|S13|^2 + |S23|^2}$$

$$S13 = \begin{pmatrix} s11 & s12 \\ s31 & s32 \end{pmatrix}$$

$$A13 = \begin{pmatrix} a1 \\ a3 \end{pmatrix}$$

$$S23 = \begin{pmatrix} s21 & s22 \\ s31 & s32 \end{pmatrix}$$

$$A23 = \begin{pmatrix} a2 \\ a3 \end{pmatrix}$$

In the parallel imaging method according to the fifth aspect, the computation amount can be reduced to ⅔ of that of the conventional technique.

In a sixth aspect of the invention, in the parallel imaging method according to any one of the first to third aspects, the reception coils are a first reception coil, a second reception coil provided next to the first reception coil in a frequency encoding direction, a third reception coil facing the first reception coil in a phase encoding direction, and a fourth reception coil provided next to the third reception coil in a frequency encoding direction, and reduction factor R=2.

In the parallel imaging method according to the sixth aspect, by using four reception coils, a composite image obtained by unfolding a folded image can be obtained with a small computation amount and short process time.

In a seventh aspect of the invention, in the parallel imaging method according to the sixth aspect, when a pixel value of a point on an image of a reception coil of an "i" channel is $a_i$, sensitivity coefficients corresponding to reception coils of the "i" channel of two points superimposed by folding at the point on the image of the reception coil of the "i" channel are $s_{i1}$ and $s_{i2}$, the square of a determinant using, as a first row, sensitivity coefficients $s_{k1}$ and $s_{k2}$ of a reception coil of a "k" channel and using, as a second row, sensitivity coefficients $s_{m1}$ and $s_{m2}$ of the reception coil of an "m" channel is $|Skm|^2$, and a square matrix using, as a first row, sensitivity coefficients $s_{k1}$ and $s_{k2}$ of the reception coil of the "k" channel and using, as a second row, sensitivity coefficients $s_{m1}$ and $s_{m2}$ of the reception coil of the "m" channel is Skm, the operation is expressed by the following.

$$V = \frac{(|S13|^2 S13^{-1} A13 + |S14|^2 S14^{-1} A14 + |S23|^2 S23^{-1} A23 + |S24|^2 S24^{-1} A24)}{(|S13|^2 + |S14|^2 + |S23|^2 + |S24|^2)}$$

$$S13 = \begin{pmatrix} s11 & s12 \\ s31 & s32 \end{pmatrix} \quad A13 = \begin{pmatrix} a1 \\ a3 \end{pmatrix}$$

$$S14 = \begin{pmatrix} s11 & s12 \\ s41 & s42 \end{pmatrix} \quad A14 = \begin{pmatrix} a1 \\ a4 \end{pmatrix}$$

$$S23 = \begin{pmatrix} s21 & s22 \\ s31 & s32 \end{pmatrix} \quad A23 = \begin{pmatrix} a2 \\ a3 \end{pmatrix}$$

$$S24 = \begin{pmatrix} s21 & s22 \\ s41 & s42 \end{pmatrix} \quad A24 = \begin{pmatrix} a2 \\ a4 \end{pmatrix}$$

In the parallel imaging method according to the seventh aspect, the computation amount can be reduced to ⅔ of that of the conventional method.

In an eighth aspect, in the parallel imaging method according to any one of the first to third aspects, when reception coils corresponding to the selected combination of images are first to L-th channels, reduction factor is R, a combination of selected R channels from the first to L-th channels is generally a combination of the 1R-th channel to the RR-th channel, a pixel value of a point on an image of a reception coil of an "i" channel is $a_i$, sensitivity coefficients corresponding to reception coils of the "i" channel at the original R point superimposed by folding at the point on the image of the reception coil of the "i" channel are $s_{i1}, \ldots,$ and $s_{iR}$, the square of a determinant of a square matrix using, as rows, sensitivity coefficients $s_{k1}, \ldots,$ and $s_{kR}$ of a reception coil of a "k" channel is $|S1R\text{-}RR|^2$, and a square matrix using, as rows, sensitivity coefficients $s_{k1}, \ldots,$ and $s_{kR}$ of the reception coil of the "k" channel is S1R-RR, the operation is expressed by the following.

$$V = \frac{\sum |S1R - RR|^2 S1R - RR^{-1} A1R - RR}{\sum |S1R - RR|^2}$$

$$S1R - RR \begin{pmatrix} s_{1R1} & s_{k1R2} & \ldots & s_{1RR} \\ & \vdots & & \\ s_{RR1} & s_{kRR2} & \ldots & s_{RRR} \end{pmatrix} \quad A1R - RR \begin{pmatrix} a_{1R} \\ \vdots \\ a_{RR} \end{pmatrix}$$

In the parallel imaging method according to the eighth aspect, the computation amount can be reduced as compared with that of the conventional method.

According to a ninth aspect, the invention provides an MRI apparatus including: three or more reception coils; scanning means for performing a scan using the three or more reception coils and with reduced phase encoding steps; image generating means for generating an image from the data of each of the reception coils; combination selecting means for selecting a combination of images used for unfolding operation from combinations of the images; and operating means for obtaining a composite image by the operation using the selected combination of images and a sensitivity distribution of the reception coils.

The MRI apparatus according to the ninth aspect can excellently perform the parallel imaging method according to the first aspect.

In a tenth aspect, in the MRI apparatus according to the ninth aspect of the invention, the combination selecting means selects a combination of images to be used for the unfolding operation from combinations of the images on the basis of the square of a determinant of a square matrix of sensitivity coefficients of reception coils corresponding to the combination of reception coils.

The MRI apparatus according to the tenth aspect can excellently perform the parallel imaging method according to the second aspect.

In the eleventh aspect of the invention, in the MRI apparatus according to the ninth aspect, the combination selecting means selects a combination of images used for the unfolding operation from the images on the basis of the layout of the reception coils and the phase encoding direction.

The MRI apparatus according to the eleventh aspect can excellently perform the parallel imaging method according to the third aspect.

In the twelfth aspect of the invention, in the MRI apparatus according to any one of the ninth to eleventh aspects, the reception coils are a first reception coil, a second reception coil provided next to the first reception coil in a frequency encoding direction, and a third reception coil facing the first reception coil in a phase encoding direction, and reduction factor R of the scanning means is set to 2.

The MRI apparatus according to the twelfth aspect can excellently perform the parallel imaging method according to the fourth aspect.

In a thirteenth aspect of the invention, in the MRI apparatus according to the twelfth aspect, when a pixel value of a point on an image of a reception coil of an "i" channel is $a_i$, sensitivity coefficients corresponding to reception coils of the "i" channel of two original points superimposed by folding at the point on the image of the reception coil of the "i" channel are $s_{i1}$ and $s_{i2}$, the square of a determinant using, as a first row, sensitivity coefficients $s_{k1}$ and $s_{k2}$ of a reception coil of a "k" channel and using, as a second row, sensitivity coefficients $s_{m1}$ and $s_{m2}$ of the reception coil of an "m" channel is $|Skm|^2$, and a square matrix using, as a first row, sensitivity coefficients $s_{k1}$ and $s_{k2}$ of the reception coil of the "k" channel and using, as a second row, sensitivity coefficients $s_{m1}$ and $s_{m2}$ of the reception coil of the "m" channel is Skm, the operation means performs operation expressed by the following.

$$V = \frac{|S13|^2 S13^{-1} A13 + |S23|^2 S23^{-1} A23}{|S13|^2 + |S23|^2}$$

$$S13 = \begin{pmatrix} s11 & s12 \\ s31 & s32 \end{pmatrix} \quad A13 = \begin{pmatrix} a1 \\ a3 \end{pmatrix}$$

$$S23 = \begin{pmatrix} s21 & s22 \\ s31 & s32 \end{pmatrix} \quad A23 = \begin{pmatrix} a2 \\ a3 \end{pmatrix}$$

The MRI apparatus according to the thirteenth aspect can excellently perform the parallel imaging method according to the fifth aspect.

In a fourteenth aspect of the invention, in the MRI apparatus according to any one of the ninth to eleventh aspects, the reception coils are a first reception coil, a second reception coil provided next to the first reception coil in a frequency encoding direction, a third reception coil facing the first reception coil in a phase encoding direction, and a fourth reception coil provided next to the third reception coil in a frequency encoding direction, and reduction factor R of the scanning means is set to 2.

The MRI apparatus according to the fourteenth aspect can excellently perform the parallel imaging method according to the sixth aspect.

In a fifteenth aspect of the invention, in the MRI apparatus according to the fourteenth aspect, when a pixel value of a point on an image of a reception coil of an "i" channel is $a_i$, sensitivity coefficients corresponding to reception coils of the "i" channel of original two points superimposed by folding at the point on the image of the reception coil of the "i" channel are $s_{i1}$ and $s_{i2}$, the square of a determinant using, as a first row, sensitivity coefficients $s_{k1}$ and $s_{k2}$ of a reception coil of a "k" channel and using, as a second row, sensitivity coefficients $s_{m1}$ and $s_{m2}$ of the reception coil of an "m" channel is $|Skm|^2$, and a square matrix using, as a first row, sensitivity coefficients $s_{k1}$ and $s_{k2}$ of the reception coil of the "k" channel and using, as a second row, sensitivity coefficients $s_{m1}$ and $s_{m2}$ of the reception coil of the "m" channel is Skm, the operating means performs operation expressed by the following.

$$V = \frac{(|S13|^2 S13^{-1} A13 + |S14|^2 S14^{-1} A14 + |S23|^2 S23^{-1} A23 + |S24|^2 S24^{-1} A24)}{(|S13|^2 + |S14|^2 + |S23|^2 + |S24|^2)}$$

$$S13 = \begin{pmatrix} s11 & s12 \\ s31 & s32 \end{pmatrix} \quad A13 = \begin{pmatrix} a1 \\ a3 \end{pmatrix}$$

$$S14 = \begin{pmatrix} s11 & s12 \\ s41 & s42 \end{pmatrix} \quad A14 = \begin{pmatrix} a1 \\ a4 \end{pmatrix}$$

$$S23 = \begin{pmatrix} s21 & s22 \\ s31 & s32 \end{pmatrix} \quad A23 = \begin{pmatrix} a2 \\ a3 \end{pmatrix}$$

$$S24 = \begin{pmatrix} s21 & s22 \\ s41 & s42 \end{pmatrix} \quad A24 = \begin{pmatrix} a2 \\ a4 \end{pmatrix}$$

The MRI apparatus according to the fifteenth aspect can excellently perform the parallel imaging method according to the seventh aspect.

In a sixteenth aspect of the invention, in the MRI apparatus according to any one of the ninth to eleventh aspects, when reception coils corresponding to the combination of images selected by the combination selecting means are first to L-th channels, reduction factor is R, a combination of selected R channels from the first to L-th channels is generally a combination of the 1R-th channel to the RR-th channel, a pixel value of a point on an image of a reception coil of an "i" channel is $a_i$, sensitivity coefficients corresponding to reception coils of the "i" channel at the original R point superimposed by folding at the point on the image of the reception coil of the "i" channel are $s_{i1}, \ldots,$ and $s_{iR}$, the square of a determinant of a square matrix using, as rows, sensitivity coefficients $s_{k1}, \ldots,$ and $s_{kR}$ of a reception coil of a "k" channel is $|S1R\text{-}RR|^2$, and a square matrix using, as rows, sensitivity coefficients $s_{k1}, \ldots,$ and $s_{kR}$ of the reception coil of the "k" channel is S1R-RR, the operating means performs operation expressed by the following.

$$V = \frac{\sum |S1R - RR|^2 S1R - RR^{-1} A1R - RR}{\sum |S1R - RR|^2}$$

$$S1R - RR \begin{pmatrix} s_{1R1} & s_{k1R2} & \ldots & s_{1RR} \\ \vdots & & & \\ s_{RR1} & s_{kRR2} & \ldots & s_{RRR} \end{pmatrix} \quad A1R - RR \begin{pmatrix} a_{1R} \\ \vdots \\ a_{RR} \end{pmatrix}$$

The MRI apparatus according to the sixteenth aspect can excellently perform the parallel imaging method according to the eighth aspect.

By the parallel imaging method and the MRI apparatus of the present invention, in parallel imaging using three or more reception coils, a composite image can be obtained by unfolding operation with a small computation amount and short processing time.

The parallel imaging method and the MRI apparatus of the invention can be used for a fast MRI.

Further objects and advantages of the present invention will be apparent from the following description of the preferred embodiments of the invention as illustrated in the accompanying drawings.

BRIEF DESCRIPTION OF THE DRAWINGS

FIG. 6 is a flowchart showing parallel imaging process according to a third embodiment.

DETAILED DESCRIPTION OF THE INVENTION

The present invention will be described more specifically by embodiments shown in the diagrams hereinbelow. The present invention is not limited to the embodiments.

First Embodiment

Figure 1:
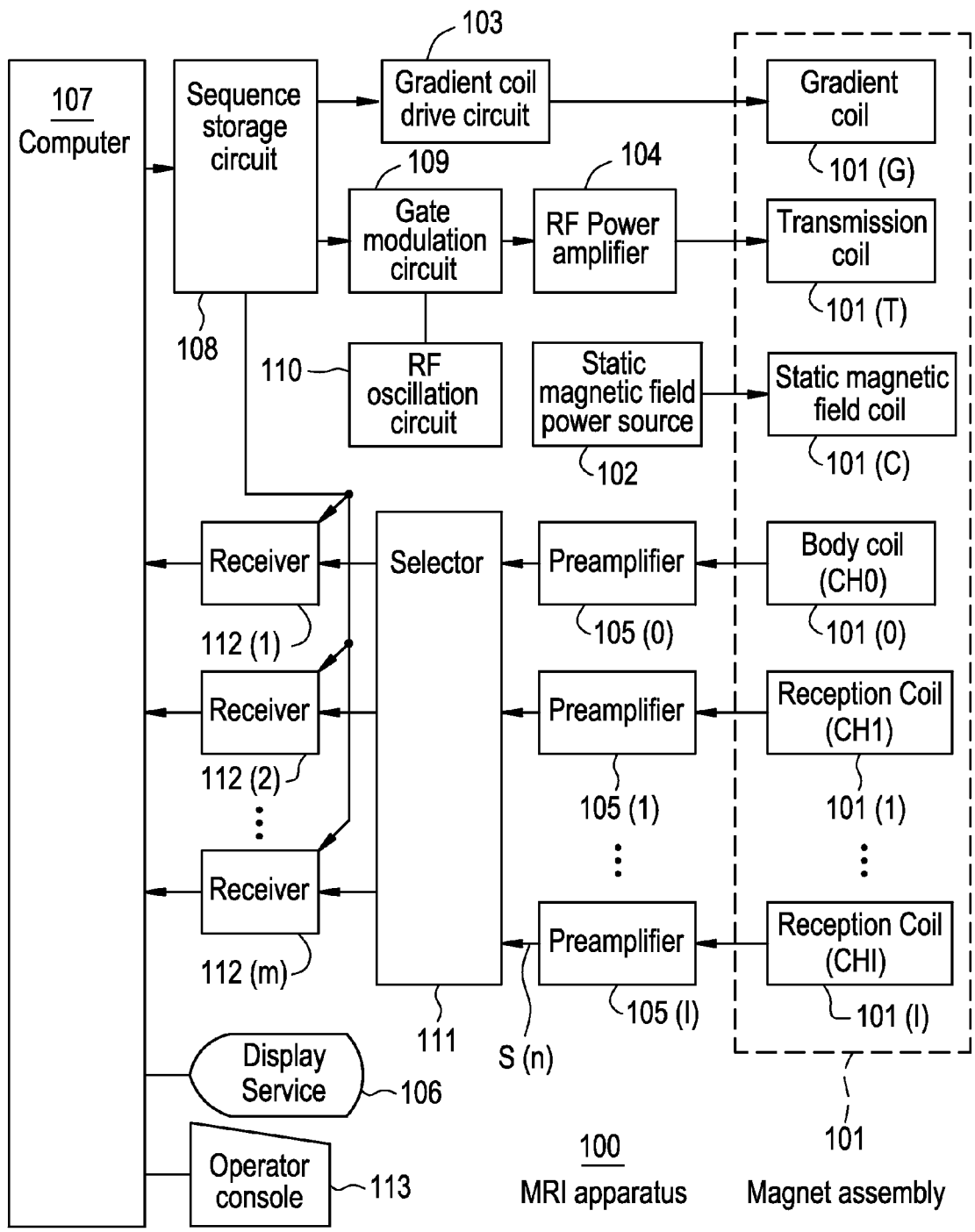
FIG. 1 is a configuration block diagram showing an MRI apparatus according to a first embodiment.

FIG. 1 is a block diagram showing an MRI apparatus 100 of the first embodiment.

In the MRI apparatus 100, a magnet assembly 101 has therein a space (bore) for inserting a subject. A static magnetic field coil 101C for applying a constant static magnetic field to the subject, a gradient coil 101G for generating gradient magnetic fields of the X axis, the Y axis, and the Z axis, a transmission coil 101T for applying an RF pulse for exciting spins of atomic nuclei in the subject, a body coil 101(0) for receiving an NMR signal from the subject, and reception coils 101(1), . . . , and 101(I) of I ($\geq 3$) channels are arranged so as to surround the space.

The static magnetic field coil 101C, the gradient coil 101G, and the transmission coil 101T are connected to a static magnetic field power source 102, a gradient coil drive circuit 103, and an RF power amplifier 104, respectively. The body coil 101(0) and the reception coils 101(1) to 101(I) are connected to a preamplifier 105(0) and preamplifiers 105(1) to 105(I), respectively.

There is a case that the body coil 101(0) is used as the transmission coil 101T.

In place of the static magnetic field coil 101C, a permanent magnet may be used.

A sequence storage circuit 108 operates the gradient coil drive circuit 103 on the basis of a stored pulse sequence in accordance with an instruction from a computer 107 to make the gradient coil 101G generate a gradient magnetic field, operates a gate modulation circuit 109 to modulate a carrier wave output signal of an RF oscillation circuit 110 to a pulse signal having a predetermined envelope shape and a predetermined phase at predetermined timings, and applies the pulse signal as an RF pulse to the RF power amplifier 104. The RF pulse is subjected to power amplification in the RF power amplifier 104, and the resultant signal is applied to the transmission coil 101T.

A selector 111 transmits NMR signals received by the body coil 101(0) and the reception coils 101(1) to 101(I) and amplified by the preamplifiers 105(0) and 105(1) to 105(I) to "m" pieces of receives 112(1), 112(2), ..., and 112(m) to vary the correspondence between the body coil 101(0) and the reception coils 101(1), ..., and 101(I) and the receivers 112(1), 112(2), ..., and 112(m).

Each of the receivers 112(1), 112(2), ..., and 112(m) converts the NMR signal to a digital signal and inputs the digital signal to the computer 107.

The computer 107 reads a digital signal from the receiver 112 and performs a process to generate an MR image. The computer 107 performs general control such as reception of information entered with an operator console 113.

A display device 106 displays an image and a message.

Figure 2:
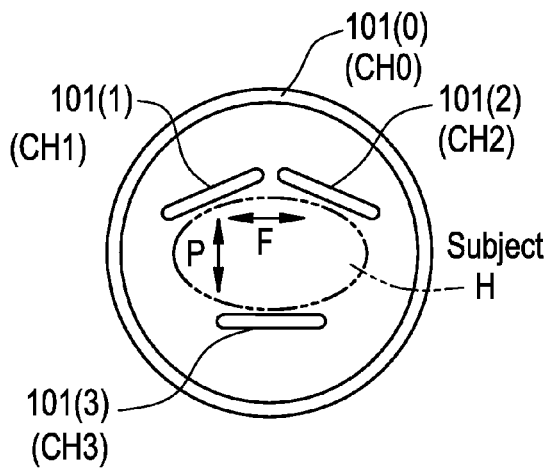
FIG. 2 is a conceptual diagram showing layout of reception coils according to the first embodiment.

FIG. 2 is a conceptual diagram showing an example of layout of the body coil 101(0) and the reception coils 101(1), 101(2), and 101(3) in the case where I=3 in the first embodiment.

The reception coil reception coil 101(1) of a first channel CH1 is disposed diagonally upper left of a subject H, the reception coil reception coil 101(2) of a second channel CH2 is disposed diagonally upper right of the subject H, and the reception coil reception coil 101(3) of a third channel CH3 is disposed under the subject H.

The vertical direction of the subject H is a phase encoding direction P, and the horizontal direction of the subject H is a frequency encoding direction F.

Figure 3:
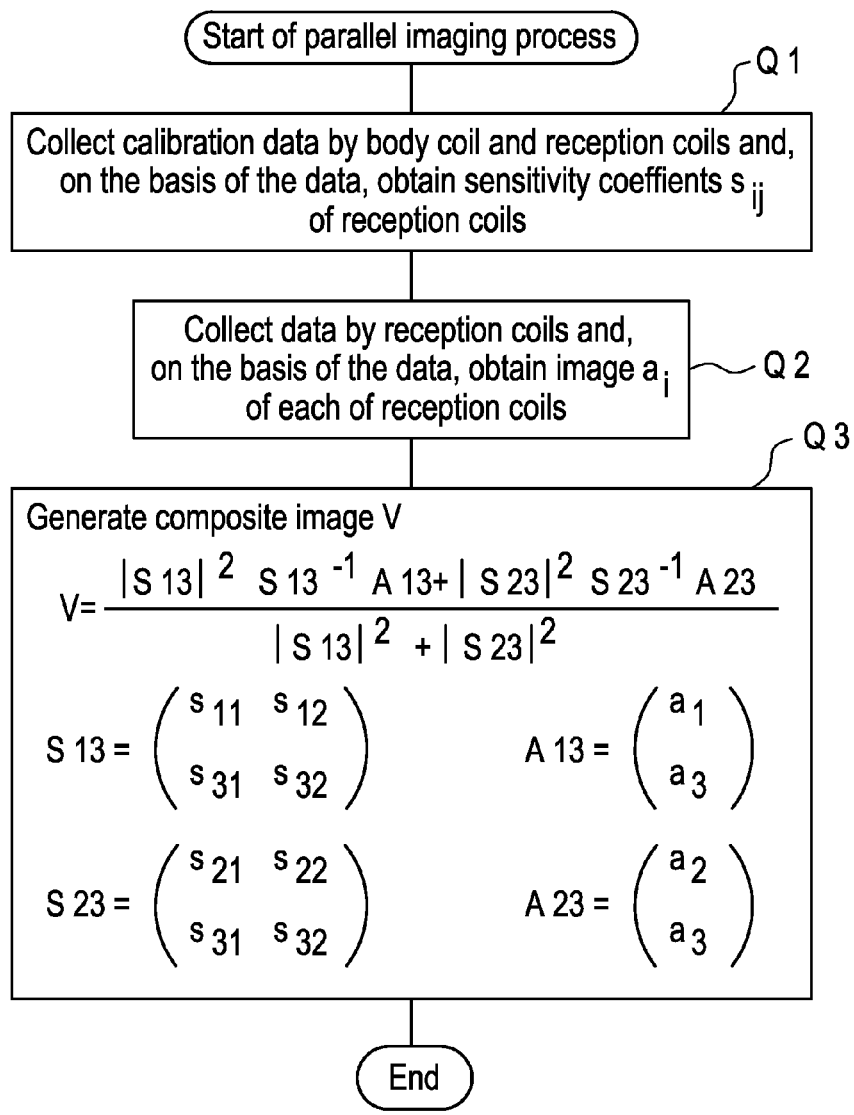
FIG. 3 is a flowchart showing parallel imaging process according to the first embodiment.

FIG. 3 is a flowchart showing parallel imaging process according to the first embodiment.

In step Q1, a scan using the body coil 101(0) and with phase encoding steps which are not reduced is performed and calibration data is collected. A scan using the reception coils 101(1), 101(2), and 101(3) and with phase encoding steps reduced by a reduction factor R=2 is performed and calibration data is collected. On the basis of the calibration data, sensitivity coefficients $s_{11}$ and $s_{12}$ of the reception coil 101(1), sensitivity coefficients $s_{21}$ and $s_{22}$ of the reception coil 101(2), and sensitivity coefficients $s_{31}$ and $s_{32}$ of the reception coil 101(3) are obtained.

In step Q2, the scan using the reception coils 101(1), 101(2), and 101(3) and with the phase encoding steps reduced by the reduction factor R=2 is performed, and data is collected. On the basis of the data, an image $a_1$ of the reception coil 101(1), an image $a_2$ of the reception coil 101(2), and an image $a_3$ of the reception coil 101(3) are obtained.

In step Q3, a composite image V is generated by the following.

$$V = \frac{|S13|^2 S13^{-1} A13 + |S23|^2 S23^{-1} A23}{|S13|^2 + |S23|^2}$$

$$S13 = \begin{pmatrix} s11 & s12 \\ s31 & s32 \end{pmatrix} \quad A13 = \begin{pmatrix} a1 \\ a3 \end{pmatrix}$$

$$S23 = \begin{pmatrix} s21 & s22 \\ s31 & s32 \end{pmatrix} \quad A23 = \begin{pmatrix} a2 \\ a3 \end{pmatrix}$$

After that, the process is finished.

By the MRI apparatus 100 of the first embodiment, the computation amount can be reduced to ⅔ of that in the conventional method and, accordingly, the process time can be also shortened.

Second Embodiment

Figure 4:
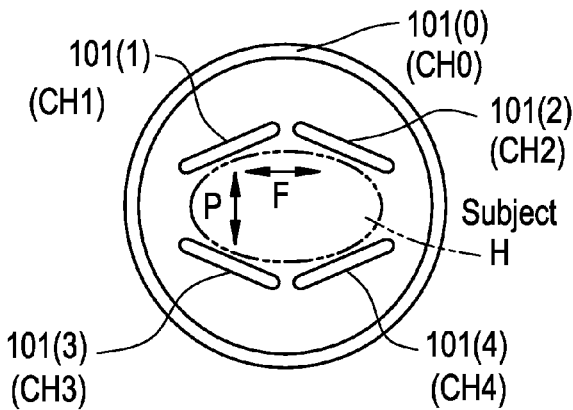
FIG. 4 is a conceptual diagram showing layout of reception coils according to a second embodiment.

FIG. 4 is a conceptual diagram showing an example of layout of the body coil 101(0) and reception coils 101(1), 101(2), 101(3), and 101(4) in the case where I=4 in a second embodiment.

The reception coil reception coil 101(1) of a first channel CH1 is disposed diagonally upper left of a subject H, the reception coil reception coil 101(2) of the second channel CH2 is disposed diagonally upper right of the subject H, the reception coil reception coil 101(3) of the third channel CH3 is disposed diagonally lower left of the subject H, and a reception coil reception coil 101(4) of a fourth channel CH4 is disposed under the subject H.

The vertical direction of the subject H is the phase encoding direction P, and the horizontal direction of the subject H is the frequency encoding direction F.

Figure 5:
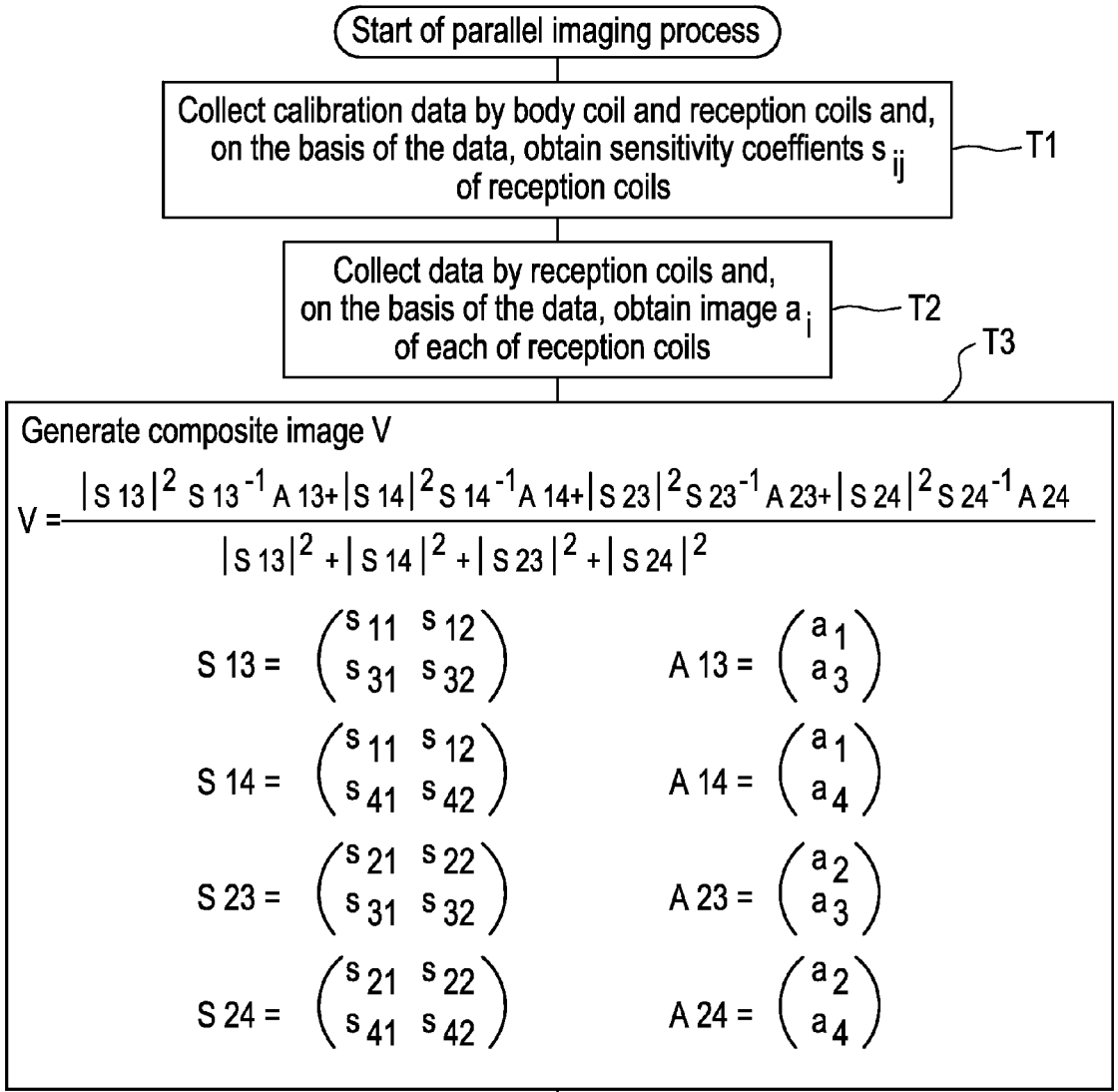
FIG. 5 is a flowchart showing parallel imaging process according to the second embodiment.

FIG. 5 is a flowchart showing parallel imaging process according to the second embodiment.

In step T1, a scan using the body coil 101(0) and with phase encoding steps which are not reduced is performed, and calibration data is collected. A scan using the reception coils 101(1), 101(2), 101(3), and 101(4) and with phase encoding steps reduced by a reduction factor R=2 is performed, and calibration data is collected. On the basis of the calibration data, sensitivity coefficients $s_{11}$ and $s_{12}$ of the reception coil 101(1), sensitivity coefficients $s_{21}$ and $s_{22}$ of the reception coil 101(2), sensitivity coefficients $s_{31}$ and $s_{32}$ of the reception coil 101(3), and sensitivity coefficients $s_{41}$ and $s_{42}$ of the reception coil 101(4) are obtained.

In step T2, the scan using the reception coils 101(1), 101(2), 101(3), and 101(4) and with the phase encoding steps reduced by the reduction factor R=2 is performed, and data is collected. On the basis of the data, an image $a_1$ of the reception coil 101(1), an image $a_2$ of the reception coil 101(2), an image $a_3$ of the reception coil 101(3), and an image $a_4$ of the reception coil 101(4) are obtained.

In step T3, a composite image V is generated by the following.

$$V = \frac{(|S13|^2 S13^{-1} A13 + |S14|^2 S14^{-1} A14 + |S23|^2 S23^{-1} A23 + |S24|^2 S24^{-1} A24)}{(|S13|^2 + |S14|^2 + |S23|^2 + |S24|^2)}$$

-continued $$S13 = \begin{pmatrix} s11 & s12 \\ s31 & s32 \end{pmatrix} \quad A13 = \begin{pmatrix} a1 \\ a3 \end{pmatrix}$$

$$S14 = \begin{pmatrix} s11 & s12 \\ s41 & s42 \end{pmatrix} \quad A14 = \begin{pmatrix} a1 \\ a4 \end{pmatrix}$$

$$S23 = \begin{pmatrix} s21 & s22 \\ s31 & s32 \end{pmatrix} \quad A23 = \begin{pmatrix} a2 \\ a3 \end{pmatrix}$$

$$S24 = \begin{pmatrix} s21 & s22 \\ s41 & s42 \end{pmatrix} \quad A24 = \begin{pmatrix} a2 \\ a4 \end{pmatrix}$$

After that, the process is finished.

By the MRI apparatus of the second embodiment, the computation amount can be reduced to ⅔ of that in the conventional method and, accordingly, the process time can be also shortened.

Third Embodiment

FIG. 6 is a flowchart showing parallel imaging process according to a third embodiment.

In step G1, a scan using the body coil 101(0) and with phase encoding steps which are not reduced is performed, and calibration data is collected. A scan using the reception coils 101(1), . . . , and 101(I) and with phase encoding steps reduced by a reduction factor R is performed, and calibration data is collected. On the basis of the calibration data, when i=1, . . . , and I, sensitivity coefficients $s_{i1}$ . . . , and $s_{iR}$ of the reception coil 101(1) are obtained.

In step G2, a scan using the reception coils 101(1) to 101(I) and with the phase encoding steps reduced by the reduction factor R is performed, and data is collected. On the basis of the data, an image $a_i$ of the reception coil 101(i) is obtained.

In step G3, R pieces are selected from the reception coils 101(1) to 101(I) to form a combination. The number of combinations formed is $_IC_R$. Subsequently, the square of a determinant of a square matrix of the sensitivity coefficients of the reception coils belonging to each of the combinations is calculated. For example, when the reception coils 101(1R) to 101(RR) belong to a certain combination, the square $|S1R-RR|^2$ of the determinant of the square matrix of the sensitivity coefficients as shown by the following equation is calculated.

$$|S1R - RR|^2 = \begin{vmatrix} s_{1R1} & s_{k1R2} & \ldots & s_{1RR} \\ & \vdots & & \\ s_{RR1} & s_{kRR2} & \ldots & s_{RRR} \end{vmatrix}^2$$

The calculated values are compared with each other and only a combination having a value of 20% or higher of the average value of the values is selected.

In step G4, a composite image V is generated by using only the selected combination.

$$V = \frac{\sum |S1R - RR|^2 S1R - RR^{-1} A1R - RR`}{\sum |S1R - RR|^2}$$

$$S1R - RR\begin{pmatrix} s_{1R1} & s_{k1R2} & \ldots & s_{1RR} \\ & \vdots & & \\ s_{RR1} & s_{kRR2} & \ldots & s_{RRR} \end{pmatrix} \quad A1R - RR\begin{pmatrix} a_{1R} \\ \vdots \\ a_{RR} \end{pmatrix}$$

After that, the process is finished.

By the MRI apparatus of the third embodiment, the computation amount can be reduced as compared with that in the conventional method and, accordingly, the process time can be also shortened.

Many widely different embodiments of the invention may be configured without departing from the spirit and the scope of the present invention. It should be understood that the present invention is not limited to the specific embodiments described in the specification, except as defined in the appended claims.

The invention claimed is:

1. A parallel imaging method for use with a magnetic resonance imaging apparatus, said method comprising the steps of:

performing a scan using three or more reception coils and with reduced phase encoding steps;

collecting data for each of the reception coils from the scan;

generating an image for each of the reception coils from the data;

selecting a combination of the generated images for use in an unfolding operation, the combination selected from a plurality of possible combinations of the images, wherein at least one of the plurality of possible combinations is not selected; and obtaining a composite image by performing the unfolding operation using the selected combination of images and a sensitivity distribution of the reception coils.

2. The parallel imaging method according to claim 1, wherein the selected combination of images used for the unfolding operation is selected from the plurality of possible combinations of the images on the basis of the square of a determinant of a square matrix of sensitivity coefficients of the reception coils corresponding to the images in the combination.

3. The parallel imaging method according to claim 1, wherein the selected combination of images used for the unfolding operation is selected from the images on the basis of a layout of the reception coils and the phase encoding direction.

4. The parallel imaging method according to claim 1, wherein the reception coils include a first reception coil, a second reception coil provided next to the first reception coil in a frequency encoding direction, and a third reception coil facing the first reception coil in a phase encoding direction, and reduction factor R=2.

5. The parallel imaging method according to claim 4, wherein when a pixel value of a point on an image of a reception coil of an "i" channel is $a_i$, sensitivity coefficients corresponding to reception coils of the "i" channel of two points superimposed by folding at the point on the image of the reception coil of the "i" channel are $s_{i1}$ and $s_{i2}$, the square of a determinant using, as a first row, sensitivity coefficients $s_{k1}$ and $s_{k2}$ of a reception coil of a "k" channel and using, as a second row, sensitivity coefficients $s_{m1}$ and $s_{m2}$ of the reception coil of an "m" channel is $|Skm|^2$, and a square matrix using, as a first row, sensitivity coefficients $s_{k1}$ and $s_{k2}$ of the reception coil of the "k" channel and using, as a second row, sensitivity coefficients $s_{m1}$ and $s_{m2}$ of the reception coil of the "m" channel is Skm, the operation is expressed by the following.

$$V = \frac{|S13|^2 S13^{-1} A13 + |S23|^2 S23^{-1} A23}{|S13|^2 + |S23|^2}$$

$$S13 = \begin{pmatrix} s11 & s12 \\ s31 & s32 \end{pmatrix} \quad A13 = \begin{pmatrix} a1 \\ a3 \end{pmatrix}$$

$$S23 = \begin{pmatrix} s21 & s22 \\ s31 & s32 \end{pmatrix} \quad A23 = \begin{pmatrix} a2 \\ a3 \end{pmatrix}.$$

6. The parallel imaging method according to claim 1, wherein the reception coils include a first reception coil, a second reception coil provided next to the first reception coil in a frequency encoding direction, a third reception coil facing the first reception coil in a phase encoding direction, and a fourth reception coil provided next to the third reception coil in a frequency encoding direction, and reduction factor R=2.

7. The parallel imaging method according to claim 6, wherein when a pixel value of a point on an image of a reception coil of an "i" channel is $a_i$, sensitivity coefficients corresponding to reception coils of the "i" channel of two points superimposed by folding at the point on the image of the reception coil of the "i" channel are $s_{i1}$ and $s_{i2}$, the square of a determinant using, as a first row, sensitivity coefficients $s_{k1}$ and $s_{k2}$ of a reception coil of a "k" channel and using, as a second row, sensitivity coefficients $s_{m1}$ and $s_{m2}$ of the reception coil of an "m" channel is $|Skm|^2$, and a square matrix using, as a first row, sensitivity coefficients $s_{k1}$ and $s_{k2}$ of the reception coil of the "k" channel and using, as a second row, sensitivity coefficients $s_{m1}$ and $s_{m2}$ of the reception coil of the "m" channel is Skm, the operation is expressed by the following.

$$V = \frac{(|S13|^2 S13^{-1} A13 + |S14|^2 S14^{-1} A14 + |S23|^2 S23^{-1} A23 + |S24|^2 S24^{-1} A24)}{(|S13|^2 + |S14|^2 + |S23|^2 + |S24|^2)}$$

$$S13 = \begin{pmatrix} s11 & s12 \\ s31 & s32 \end{pmatrix} \quad A13 = \begin{pmatrix} a1 \\ a3 \end{pmatrix}$$

$$S14 = \begin{pmatrix} s11 & s12 \\ s41 & s42 \end{pmatrix} \quad A14 = \begin{pmatrix} a1 \\ a4 \end{pmatrix}$$

$$S23 = \begin{pmatrix} s21 & s22 \\ s31 & s32 \end{pmatrix} \quad A23 = \begin{pmatrix} a2 \\ a3 \end{pmatrix}$$

$$S24 = \begin{pmatrix} s21 & s22 \\ s41 & s42 \end{pmatrix} \quad A24 = \begin{pmatrix} a2 \\ a4 \end{pmatrix}.$$

8. The parallel imaging method according to claim 1, wherein when reception coils corresponding to the selected combination of images are first to L-th channels, reduction factor is R, a combination of selected R channels from the first to L-th channels is generally a combination of the 1R-th channel to the RR-th channel, a pixel value of a point on an image of a reception coil of an "i" channel is $a_i$, sensitivity coefficients corresponding to reception coils of the "i" channel at the original R point superimposed by folding at the point on the image of the reception coil of the "i" channel are $s_{i1}, \ldots,$ and $s_{iR}$, the square of a determinant of a square matrix using, as rows, sensitivity coefficients $s_{k1}, \ldots,$ and $s_{kR}$ of a reception coil of a "k" channel is $|S1R\text{-}RR|^2$, and a square matrix using, as rows, sensitivity coefficients $s_{k1}, \ldots,$ and $s_{kR}$ of the reception coil of the "k" channel is S1R-RR, the operation is expressed by the following.

$$V = \frac{\sum |S1R\text{-}RR|^2 S1R\text{-}RR^{-1} A1R\text{-}RR`}{\sum |S1R\text{-}RR|^2}$$

$$S1R\text{-}RR \begin{pmatrix} s_{1R1} & s_{k1R2} & \ldots & s_{1RR} \\ & \vdots & & \\ s_{RR1} & s_{kRR2} & \ldots & s_{RRR} \end{pmatrix} \quad A1R\text{-}RR \begin{pmatrix} a_{1R} \\ \vdots \\ a_{RR} \end{pmatrix}.$$

9. An MRI apparatus comprising:
three or more reception coils;
a scanning device for performing a scan using the three or more reception coils and with reduced phase encoding steps, thereby collecting data for each of the reception coils;
an image generating device for generating an image for each of the reception coils from the data;
a combination selecting device for selecting a combination of the generated images for use in an unfolding operation, the combination selected from a plurality of possible combinations of the images, wherein at least one of the plurality of possible combinations is not selected; and
an operating device for obtaining a composite image by performing the unfolding operation using the selected combination of images and a sensitivity distribution of the reception coils.

10. The MRI apparatus according to claim 9, wherein the combination selecting device selects the selected combination of images to be used for the unfolding operation from the plurality of possible combinations of the images on the basis of the square of a determinant of a square matrix of sensitivity coefficients of reception coils corresponding to the images in the combination.

11. The MRI apparatus according to claim 9, wherein the combination selecting device selects the selected combination of images used for the unfolding operation from the images on the basis of a layout of the reception coils and the phase encoding direction.

12. The MRI apparatus according to claim 9, wherein the reception coils comprise a first reception coil, a second reception coil provided next to the first reception coil in a frequency encoding direction, and a third reception coil facing the first reception coil in a phase encoding direction, and reduction factor R=2.

13. The MRI apparatus according to claim 12, wherein when a pixel value of a point on an image of a reception coil of an "i" channel is $a_i$, sensitivity coefficients corresponding to reception coils of the "i" channel of two points superimposed by folding at the point on the image of the reception coil of the "i" channel are $s_{i1}$ and $s_{i2}$, the square of a determinant using, as a first row, sensitivity coefficients $s_{k1}$ and $s_{k2}$ of a reception coil of a "k" channel and using, as a second row, sensitivity coefficients $s_{m1}$ and $s_{m2}$ of the reception coil of an "m" channel is $|Skm|^2$, and a square matrix using, as a first row, sensitivity coefficients $s_{k1}$ and $s_{k2}$ of the reception coil of the "k" channel and using, as a second row, sensitivity coefficients $s_{m1}$ and $s_{m2}$ of the reception coil of the "m" channel is Skm, the operation device performs operation expressed by the following.

$$V = \frac{|S13|^2 S13^{-1} A13 + |S23|^2 S23^{-1} A23}{|S13|^2 + |S23|^2}$$

-continued $$S13 = \begin{pmatrix} s11 & s12 \\ s31 & s32 \end{pmatrix} \quad A13 = \begin{pmatrix} a1 \\ a3 \end{pmatrix}$$

$$S23 = \begin{pmatrix} s21 & s22 \\ s31 & s32 \end{pmatrix} \quad A23 = \begin{pmatrix} a2 \\ a3 \end{pmatrix}.$$

14. The MRI apparatus according to claim 9, wherein the reception coils comprise a first reception coil, a second reception coil provided next to the first reception coil in a frequency encoding direction, a third reception coil facing the first reception coil in a phase encoding direction, and a fourth reception coil provided next to the third reception coil in a frequency encoding direction, and reduction factor R of the scanning device is set to 2.

15. The MRI apparatus according to claim 14, wherein when a pixel value of a point on an image of a reception coil of an "i" channel is $a_i$, sensitivity coefficients corresponding to reception coils of the "i" channel of original two points superimposed by folding at the point on the image of the reception coil of the "i" channel are $s_{i1}$ and $s_{i2}$, the square of a determinant using, as a first row, sensitivity coefficients $s_{k1}$ and $s_{k2}$ of a reception coil of a "k" channel and using, as a second row, sensitivity coefficients $s_{m1}$ and $s_{m2}$ of the reception coil of an "m" channel is $|Skm|^2$, and a square matrix using, as a first row, sensitivity coefficients $s_{k1}$ and $s_{k2}$ of the reception coil of the "k" channel and using, as a second row, sensitivity coefficients $s_{m1}$ and $s_{m2}$ of the reception coil of the "m" channel is Skm, the operating device performs operation expressed by the following.

$$V = \frac{(|S13|^2 S13^{-1} A13 + |S14|^2 S14^{-1} A14 + |S23|^2 S23^{-1} A23 + |S24|^2 S24^{-1} A24)}{(|S13|^2 + |S14|^2 + |S23|^2 + |S24|^2)}$$

$$S13 = \begin{pmatrix} s11 & s12 \\ s31 & s32 \end{pmatrix} \quad A13 = \begin{pmatrix} a1 \\ a3 \end{pmatrix}$$

$$S14 = \begin{pmatrix} s11 & s12 \\ s41 & s42 \end{pmatrix} \quad A14 = \begin{pmatrix} a1 \\ a4 \end{pmatrix}$$

$$S23 = \begin{pmatrix} s21 & s22 \\ s31 & s32 \end{pmatrix} \quad A23 = \begin{pmatrix} a2 \\ a3 \end{pmatrix}$$

$$S24 = \begin{pmatrix} s21 & s22 \\ s41 & s42 \end{pmatrix} \quad A24 = \begin{pmatrix} a2 \\ a4 \end{pmatrix}.$$

16. The MRI apparatus according to claim 9, wherein when reception coils corresponding to a combination of images selected by the combination selecting device are first to L-th channels, reduction factor is R, a combination of selected R channels from the first to L-th channels is generally a combination of the 1R-th channel to the RR-th channel, a pixel value of a point on an image of a reception coil of an "i" channel is $a_i$, sensitivity coefficients corresponding to reception coils of the "i" channel at the original R point superimposed by folding at the point on the image of the reception coil of the "i" channel are $s_{i1}, \ldots,$ and $s_{iR}$, the square of a determinant of a square matrix using, as rows, sensitivity coefficients $s_{k1}, \ldots,$ and $s_{kR}$ of a reception coil of a "k" channel is $|S1R\text{-}RR|^2$, and a square matrix using, as rows, sensitivity coefficients $s_{k1}, \ldots,$ and $s_{kR}$ of the reception coil of the "k" channel is S1R-RR, the operating device performs operation expressed by the following.

$$V = \frac{\sum |S1R-RR|^2 S1R-RR^{-1} A1R-RR}{\sum |S1R-RR|^2}$$

$$S1R-RR \begin{pmatrix} s_{1R1} & s_{k1R2} & \ldots & s_{1RR} \\ \vdots & & & \\ s_{RR1} & s_{kRR2} & \ldots & s_{RRR} \end{pmatrix} \quad A1R-RR \begin{pmatrix} a_{1R} \\ \vdots \\ a_{RR} \end{pmatrix}.$$

17. A system for obtaining a composite image, said system comprising:
a scanning device including at least three reception coils having a sensitivity distribution, said scanning device configured to collect data from the reception coils using reduced phase encoding steps; and
an imaging device configured to:
generate an image for each of the reception coils from the collected data,
select a combination of the generated images, wherein at least one possible combination of the generated images is not selected, and
generate a composite image based on the selected combination of images and the sensitivity distribution of the reception coils.

18. The system according to claim 17, wherein the imaging device selects the selected combination of images on the basis of the square of a determinant of a square matrix of sensitivity coefficients of reception coils corresponding to the images in the combination.

19. The system according to claim 17, wherein the imaging device selects the selected combination of images used for the unfolding operation from the images on the basis of a layout of the reception coils and the phase encoding direction.

20. The system according to claim 17, wherein the reception coils include a first reception coil, a second reception coil provided next to the first reception coil in a frequency encoding direction, and a third reception coil facing the first reception coil in a phase encoding direction, and reduction factor R=2.

* * * * *